United States Patent
Guibbert et al.

(10) Patent No.: US 9,988,829 B2
(45) Date of Patent: Jun. 5, 2018

(54) METHOD OF CALIBRATING A STANDBY DURATION OF A PROXIMITY DETECTION SENSOR AND ASSOCIATED SENSOR

(71) Applicants: CONTINENTAL AUTOMOTIVE FRANCE, Toulouse (FR); CONTINENTAL AUTOMOTIVE GmbH, Hannover (DE)

(72) Inventors: Mickael Guibbert, Toulouse (FR); Olivier Elie, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 208 days.

(21) Appl. No.: 14/932,324

(22) Filed: Nov. 4, 2015

(65) Prior Publication Data

US 2016/0145909 A1 May 26, 2016

(30) Foreign Application Priority Data

Nov. 21, 2014 (FR) ..................... 14 61314

(51) Int. Cl.
*G01D 18/00* (2006.01)
*E05B 85/10* (2014.01)
(Continued)

(52) U.S. Cl.
CPC .............. *E05B 81/77* (2013.01); *E05B 85/10* (2013.01); *G01D 5/24* (2013.01); *G01D 18/00* (2013.01);
(Continued)

(58) Field of Classification Search
CPC .............. H03K 17/955; H03K 17/962; H03K 2217/960705; H03K 2217/94031;
(Continued)

(56) References Cited

U.S. PATENT DOCUMENTS 3,129,415 A * 4/1964 McKnight .............. G08B 13/26
331/183
5,651,384 A 7/1997 Rudrich
(Continued)

FOREIGN PATENT DOCUMENTS

CN 102440063 A 5/2012
CN 103125072 A 5/2013
(Continued)

OTHER PUBLICATIONS

FR Search Report, dated Jul. 9, 2015, from corresponding FR application.

*Primary Examiner* — Alesa Allgood
(74) *Attorney, Agent, or Firm* — Young & Thompson (57) ABSTRACT

A method of calibrating a standby duration ($D_V$) of a proximity detection sensor, the sensor alternating between measurement phases ($P_M$), the evaluation duration ($D_E$) of which is measured by a first oscillator (O1) of stable frequency and standby phases ($P_V$), the predetermined standby duration ($D_V$) of which is controlled by a second oscillator (O2), the frequency of which varies according to external parameters. The method provides for performing immediately after the measurement phase ($P_M$), a second measurement phase ($P_{M2}$) during which a second evaluation duration ($D_{E2}$) is measured by the second oscillator (O2) and calibrating the standby duration ($D_V$) using the ratio between the number of oscillations (N1') generated during the evaluation duration ($D_E$) by the first oscillator (O1) and the number of oscillations (N2') generated during the second evaluation duration ($D_{E2}$) by the second oscillator (O2).

14 Claims, 4 Drawing Sheets

(51) Int. Cl.
 *G01D 5/24* (2006.01)
 *H03K 17/955* (2006.01)
(52) U.S. Cl.
 CPC . *H03K 17/955* (2013.01); *H03K 2217/94031* (2013.01); *H03K 2217/96078* (2013.01)
(58) Field of Classification Search
 CPC ........ H03K 2217/96078; B60R 21/015; B60R 21/01532; G01D 18/00
 See application file for complete search history.

(56) References Cited

U.S. PATENT DOCUMENTS

| | | | |
|---|---|---|---|
| 7,023,221 B1* | 4/2006 | Lin | G01D 5/24 324/662 |
| 9,651,355 B2* | 5/2017 | Ujvari | G01B 7/14 |
| 2007/0200669 A1 | 8/2007 | McBride et al. | |
| 2010/0164479 A1 | 7/2010 | Alameh et al. | |
| 2013/0194069 A1 | 8/2013 | Baudru et al. | |

FOREIGN PATENT DOCUMENTS

| | | |
|---|---|---|
| DE | 4226053 A1 | 2/1993 |
| EP | 0 629 759 A1 | 12/1994 |
| EP | 0724044 A1 | 7/1996 |
| FR | 2 964 517 A1 | 3/2012 |

\* cited by examiner

(Prior Art)

METHOD OF CALIBRATING A STANDBY DURATION OF A PROXIMITY DETECTION SENSOR AND ASSOCIATED SENSOR

FIELD OF THE INVENTION

The present invention relates to a method of calibrating a standby duration of a proximity detection sensor, more precisely of a charge-transfer capacitive sensor and an associated proximity sensor. More particularly, it relates to the application of such a sensor in the door handles of a vehicle for authorized users to have 'hands free' access to their vehicles.

BACKGROUND OF THE INVENTION

These days, some motor vehicles are equipped with 'hands free' access, i.e. authorized users of the vehicle no longer need a key for opening the doors and other opening elements (hood, trunk, etc.) of their vehicle. Instead of a key, they have an identification badge (or remote control) with which the vehicle's electronic system interacts.

To open a door, for example, the driver moves close to the door handle. A capacitive presence sensor, in this case a charge-transfer capacitive sensor located in the handle, detects the presence of the driver's hand. This sensor is connected to an electronic computer of the vehicle (e.g. to the BCM or Body Control Module) and sends a presence detection signal thereto. The vehicle's electronic computer has previously identified the user as being authorized to access this vehicle, or alternatively, following the reception of this detection signal, it proceeds to this identification. For this, it sends an identification request via a LF (Low Frequency) antenna to the badge (or to the remote control) carried/worn by the user. In response this card sends its identification code, via RF (radio frequency) wave, to the vehicle's electronic computer. If the electronic computer recognizes the identification code as that authorizing access to the vehicle, it triggers the opening of the door. If, on the other hand, the electronic computer has not received an identification code or if the identification code received is incorrect, opening does not take place.

Figure 1:
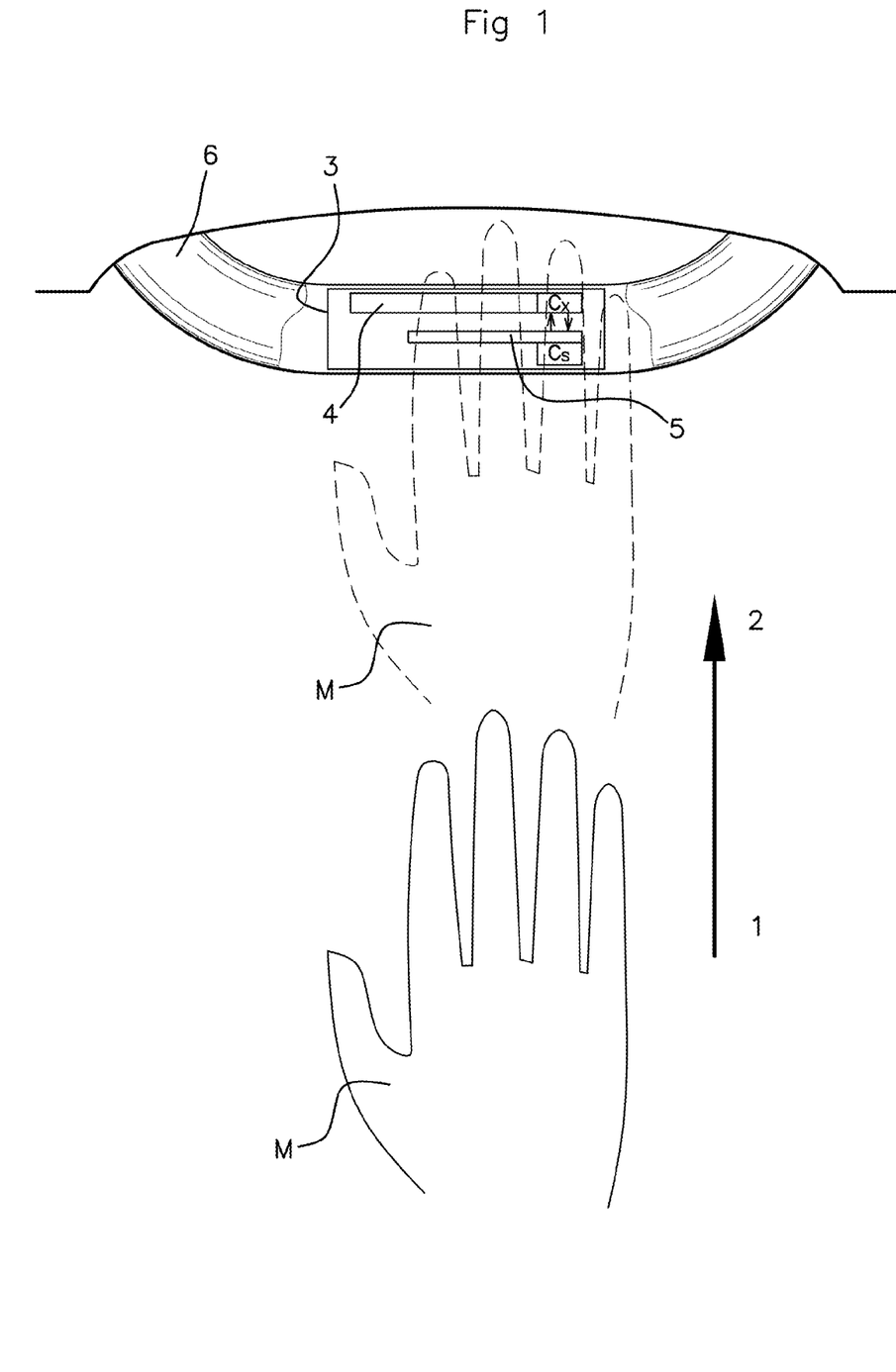
FIG. 1 represents a schematic view of a vehicle door handle incorporating a charge-transfer capacitive sensor, described previously.

As illustrated in FIG. 1, such a capacitive sensor 3 is composed of an electrode 4 incorporated in the door handle 6 and a second electrode connected to ground as well as a microcontroller (not represented in FIG. 1) located on a printed circuit 5. This second electrode may include a part of a users body and a near environment connected directly or indirectly to ground. It may involve, for example, the user's hand M, the presence of which must be detected near the door handle 6.

When the user's hand M approaches the door handle 6, i.e. it goes from position 1 to position 2 in the direction of the arrow illustrated in FIG. 1, the capacitance $C_X$ of the electrode 4 incorporated in the handle 6 increases. The variation $\Delta C_X$ is measured using a reference capacitance $C_S$, located on a printed circuit 5 connected to the electrode 4. If the value of the capacitance $C_X$ crosses a threshold, this causes the detection to be validated. This means that the user's hand M is in position 2 on the door handle 6 or sufficiently close to this handle 6 and that the user is requesting access to the vehicle.

Figure 2:
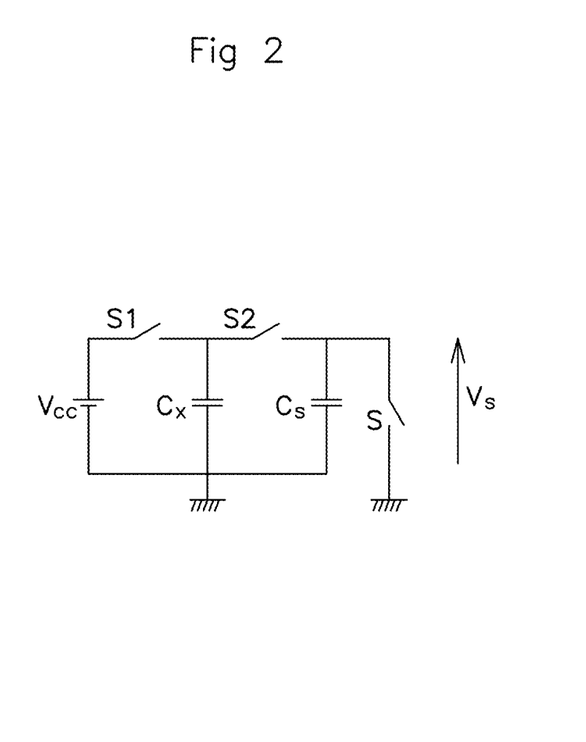
FIG. 2 represents a schematic view of a charge-transfer capacitive sensor according to the prior art, described previously, FIG. 3, explained previously, represents the measurement phases and the standby phases of the proximity detection sensor, FIG. 4, explained previously, represents the proximity detection sensor according to the prior art.

It is known from the prior art that the charge-transfer capacitive sensor 3 can be used to measure the variation $\Delta C_X$ of the capacitance $C_X$ of the electrode 4 incorporated in the door handle 6 by performing a charge transfer consisting of a large number of charges and discharges of this capacitance $C_X$ in the reference capacitance $C_S$, until reaching a set voltage threshold at the terminals of the reference capacitance $C_S$. Estimating the variation $\Delta C_X$ of the capacitance $C_X$ of the electrode 4 with respect to the previous cycle is performed based on the variation in the number of discharges of the capacitance $C_X$ of the electrode 4 in the reference capacitance $C_S$ that it took to reach this voltage threshold at the terminals of the reference capacitance $C_S$. These capacitive sensors 3 involve switching means that can be used to direct the current to first charge the capacitance $C_X$ of the electrode 4 via the supply voltage and then discharge it in the reference capacitance $C_S$. The charge transfer, i.e. the series of charges and discharges, according to the prior art, and illustrated in FIG. 2, is split into four steps:

- 1st step: the first step consists in charging the capacitance $C_X$ of the electrode 4 from the supply voltage $V_{CC}$. For this, the first switch S1 is closed and the second switch S2 is opened.
- 2nd step: once the charging is finished, the first switch S1 is opened.
- 3rd step: then the discharge of the capacitance $C_X$ of the electrode 4 in the reference capacitance $C_S$ can begin. For this the first switch S1 remains open and the second switch S2 is closed.
- 4th step: once the discharge is completed, the second switch S2 is opened.

The charge transfer is repeated until the voltage $V_S$ at the terminals of the reference capacitance $C_S$ reaches the threshold voltage $V_{TH}$. The number of discharges x of the capacitance $C_X$ of the electrode 4 to the reference capacitance $C_S$ necessary to reach this threshold $V_{TH}$ provides an image of the capacitance $C_X$ of the electrode 4. The reference capacitance $C_S$ is then completely discharged via the switch S electrically connected to ground, in preparation for the next measurement.

A counter of the number of discharges x and a microcontroller (not represented in FIG. 2) are used to determine the capacitance $C_X$ of the electrode 4.

The duration of the measurement phase $P_M$ for measuring the variation $\Delta C_X$ in the capacitance $C_X$ of the electrode 4 (i.e. the series of 4 charge transfer steps described earlier) therefore depends on said variation $\Delta C_X$. This duration, called the evaluation duration $D_E$, is measured using a first oscillator O1 of voltage V, generally a very accurate clock, e.g. a quartz oscillator, the oscillation frequency of which (also called the first oscillation frequency F1) is, for example, 8 MHz, each oscillation period being correlated with a unit of time t.

In order to limit the electrical consumption of the capacitive sensor 3, between two measurement phases $P_M$, is a standby, or idle, phase $P_V$ (see FIG. 3), during which the capacitive sensor 3 is not active, i.e. no charge transfer takes place. Said idle phase $P_V$ is generally of much longer duration than a measurement phase $P_M$.

Figure 3:
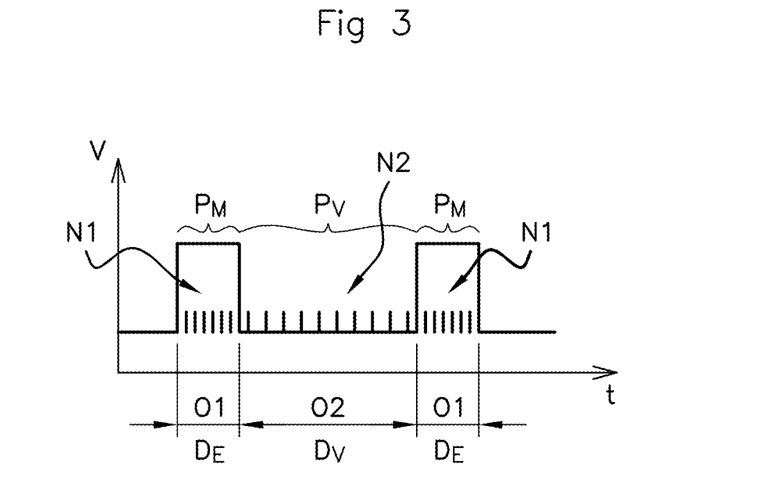

The standby duration $D_V$ of this idle phase $P_V$ is set, predetermined and controlled using a second oscillator O2 of voltage V. In order to minimize the electrical consumption during the standby phase $P_V$, the second oscillator O2 consists of an RC circuit, including a resistor and a capacitor and is much less consuming of electrical energy than a quartz oscillator, i.e. than the first oscillator O1. The second oscillation frequency F2 of the second oscillator O2 is lower, of the order of 31 kHz, and likewise each period of oscillation is correlated with a unit of time t.

Figure 4:
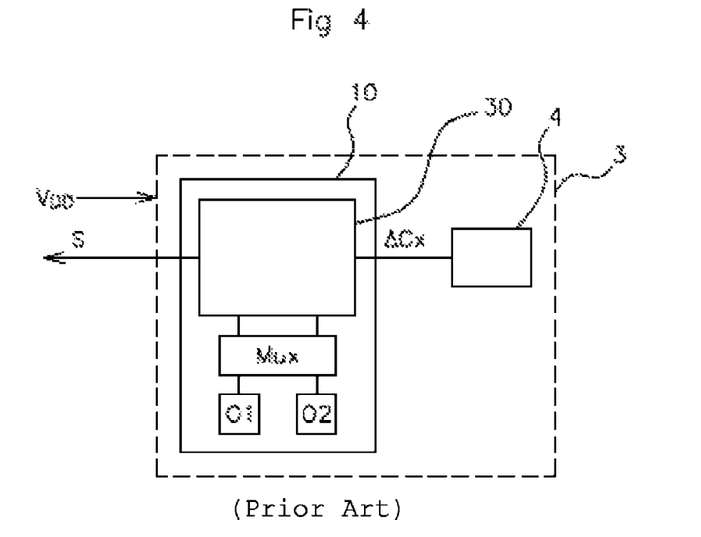

As illustrated in FIG. 4, the first and second oscillator O1, O2 are connected to a measuring unit 30, via a switching means e.g. a multiplexer MUX. The first and second oscillator O1, O2, the measuring unit 30 and the multiplexer MUX are generally included in the microcontroller 10.

The second oscillator O2 is less accurate than the first oscillator O1. Said RC circuit is sensitive to external parameters, such as the temperature or the ambient humidity and the value of its second oscillation frequency F2 varies with respect to a nominal oscillation frequency $F2_{nom}$. There are also significant variations in the oscillation frequency between several supposedly identical RC type oscillators, due to the high tolerances of the components, resistor R and capacitor C.

This significant variation in the second oscillation frequency F2, impacts on the accuracy in controlling the standby duration $D_V$, and therefore on the actual electrical consumption of the capacitive sensor 3 during said duration. The impact may be large, and between two identical capacitive sensors 3 there may be differences in electrical consumption of the order of 16%, due to the drift of the standby duration Dv caused by the variation in the second oscillation frequency F2.

The sensitivity, i.e. the reaction time of the capacitive sensor 3, is also degraded. Indeed, if the standby duration $D_V$ is extended, the capacitive sensor 3 becomes less responsive, since the duration between measurement phases $P_M$ is extended.

It is known from the prior art, to calibrate the standby duration $D_V$ using an external electronic tool that has been connected to the capacitive sensor 3, more precisely to the microcontroller 10 controlling the operation of said sensor 3 (see FIG. 4).

This tool sends a periodic signal to the microcontroller 10 of the capacitive sensor 3 (see FIG. 4), the oscillation frequency of the periodic signal is measured by the measuring unit 30 using the second oscillator O2, and the microcontroller 10 sends the measured value back to said tool. If the measured value of the second oscillation frequency F2 of the second oscillator O2 is far from the second nominal frequency $F2_{nom}$, the tool, uses software to reprogram the microcontroller 10 by changing the number of oscillations of the standby phase N2, generated by the second oscillator O2 at the second frequency F2 during the standby phase $P_V$ in order to correct the standby duration $D_V$.

However, this calibration method using an external electronic tool has several drawbacks:
- it requires a dedicated electronic tool,
- it can only be performed by authorized personnel, at a garage, dealership or at the end of the vehicle production line,
- it can only be performed at a particular time, e.g. during technical overhauls of the vehicle, it may therefore take several months, during which the capacitive sensor 3 consumes excessive electrical energy,
- it requires the cooperation of the vehicle's owner,
- it requires that the automobile be immobilized,
- it is time consuming.

Clearly, for optimizing the electrical consumption of the proximity detection sensor, the calibration method of the prior art is not satisfactory.

SUMMARY OF THE INVENTION

The invention provides a method of calibrating the standby duration of the proximity detection sensor remedying the drawbacks of the prior art.

The invention provides a method of calibrating a standby duration of a proximity detection sensor for detecting the proximity of a user, said sensor alternating between:
- a phase of measuring a representative value of the user's proximity, during an evaluation duration that varies according to said value, said evaluation duration being measured using a first oscillator, having a first oscillation frequency,
- a standby phase for a predetermined standby duration, the predetermined standby duration being longer than the evaluation duration, and being controlled by a second oscillator, having a second oscillation frequency, which varies with respect to a second nominal oscillation frequency according to parameters external to the sensor.

The calibration method is characterized in that it includes the following steps:
- Step 1: the measurement phase by the first oscillator is followed consecutively by a second measurement phase during which a second evaluation duration is measured by the second oscillator,
- Step 2: a ratio between a second number of oscillations generated by the second oscillator during the second measurement phase and a first number of oscillations generated by the first oscillator during the measurement phase is calculated,
- Step 3: the ratio thus calculated is compared with a predetermined ratio,
- Step 4: a deviation is calculated between the ratio and the predetermined ratio,
- Step 5: during the standby phase, the number of oscillations of the standby phase is corrected according to the calculated deviation in order to calibrate the standby duration.

The invention therefore judiciously uses the accurate measurement of the evaluation duration performed by the first oscillator for correcting the drift in frequency of the second oscillator and thus calibrating the standby duration. The invention is based on the assumption that the evaluation duration, which varies according to the representative value of the user's proximity, is identical for both phases of consecutive measurements performed by each of the two oscillators.

In a second embodiment, the calibration method further includes:
- Step 1b: after step 1, the second measurement phase is followed consecutively by a third measurement phase during which a third evaluation duration is measured by the first oscillator,
- Step 1c: if the first number of oscillations of the measurement phase is equal to a third number of oscillations generated during the third measurement phase, then repetition of steps 2 through 5, else the calibration procedure stops.

Advantageously, the representative value of the user's proximity is a variation in capacitance of an electrode of the proximity detection sensor.

Judiciously, the predetermined ratio is equal to the ratio between the second nominal frequency and the first frequency.

Steps 1 through 5 may be performed at each power up of the proximity detection sensor or alternatively may be repeated at a set period of the order of 120 s.

The invention also relates to a capacitive proximity detection sensor including:
- a microcontroller including a measuring unit, a detection electrode, a first oscillator, having a first oscillation frequency measuring evaluation durations during phases of measuring a variation in capacitance of the electrode, a second oscillator controlling predetermined standby durations, during standby phases of the capacitive sensor, the second oscillator having a second oscillation frequency that varies with respect to a second nominal oscillation frequency according to parameters external to the capacitive sensor, a switching means connected to the first and second oscillator and to the measuring unit, said sensor being characterized in that it further includes a calibration unit connected to the switching means and to the measuring unit included in the microcontroller and comprising:

means of performing, consecutively to the measurement phase, a second measurement phase, means of measuring a second evaluation duration using the second oscillator, means of calculating a ratio between a second number of oscillations generated by the second oscillator during the second measurement phase and a first number of oscillations generated by the first oscillator during the measurement phase, means of comparison between the ratio thus calculated and a predetermined ratio, means of calculating a deviation between the ratio and the predetermined ratio, means of correcting, during the standby phase, the number of oscillations of the standby phase according to the calculated deviation in order to calibrate the standby duration.

In the second embodiment of the invention, the capacitive proximity detection sensor further includes, in addition to the means listed above, the following means:

means of performing, consecutively to the second measurement phase, a third measurement phase, means of measuring a third evaluation duration using the first oscillator, means of comparison between the first number of oscillations of the measurement phase and a third number of oscillations generated during the third measurement phase.

The invention also applies to a motor vehicle door handle and to a vehicle including a capacitive proximity detection sensor according to the features listed above.

BRIEF DESCRIPTION OF THE DRAWINGS

Other features and advantages of the invention will emerge on reading the following description and examining the accompanying drawings in which.

DETAILED DESCRIPTION OF THE INVENTION

FIG. 4 illustrates a capacitive sensor 3 according to the prior art. The capacitive sensor 3 includes a microcontroller 10 electrically connected to an electrode 4.

The microcontroller 10 is powered by a regulated voltage $V_{DD}$ ($V_{DD}$=2.5 V) from the voltage of the vehicle battery.

In return it generates a signal S detecting the user's proximity near the capacitive sensor 3 to an electronic control unit (not represented) of the BCM or Body Control Module type, which manages the unlocking of the vehicle door.

The microcontroller 10 includes and controls a measuring unit 30 for measuring the variation in capacitance Cx of the electrode 4, electrically connected to a first oscillator O1 and to a second oscillator O2 via a switching means of the multiplexer type MUX.

The multiplexer MUX is used to connect the measuring unit 30 either to the first oscillator O1, or to the second oscillator O2.

As explained previously (see FIG. 3), the evaluation duration $D_E$ of the variation in capacitance Cx of the electrode 4, during the measurement phase $P_M$ is measured by the measuring unit 30 using the first oscillator O1, generally consisting of a very accurate quartz clock, with a first frequency F1, the oscillation period of which is correlated with a unit of time. By counting a first number of oscillations N1 of the first oscillator O1 during the measurement phase $P_M$, the measuring unit 30 deduces therefrom the evaluation duration $D_E$ in seconds.

The evaluation duration $D_E$ is variable and depends on the variation in the capacitance Cx.

The standby duration $D_V$ is controlled using the RC type second oscillator O2, having a second frequency F2, and being less accurate and less consuming of electrical energy than the first oscillator O1. The standby duration $D_V$ is set and predetermined, and generally of a much longer duration than the evaluation duration $D_E$.

By setting during the standby phase $P_V$, a set and predetermined number of oscillations of the standby phase N2, at the second oscillator O2, the measuring unit 30 controls the standby duration $D_V$ in a unit of time, e.g. in seconds. Indeed, when the second oscillator O2 has performed the number of oscillations of the predetermined standby phase N2, this means that the standby phase $P_V$ is completed, and that a new measurement phase $P_M$ can begin.

The multiplexer MUX controlled by the measuring unit 30 may therefore be used to select one or the other of the two oscillators O1, O2 for measuring and/or controlling the evaluation and standby durations $D_E$, $D_V$, according to the phase the microcontroller 10 is in, i.e. either in the measurement phase $P_M$, or in the standby phase $P_V$.

The second oscillator O2 offers the advantage of being less consuming of electrical energy than the first oscillator O1, but has the drawback of being less accurate since its second oscillation frequency F2 drifts according to parameters external to the capacitive sensor 3, such as the ambient temperature or humidity and also varies from part to part.

The result of this is that the second oscillation frequency F2 during the standby phase $P_V$ drifts and, given that the number of oscillations of the standby phase N2 is set, the standby duration $D_V$ also drifts and control of the standby duration $D_V$ becomes inaccurate.

Figure 5:
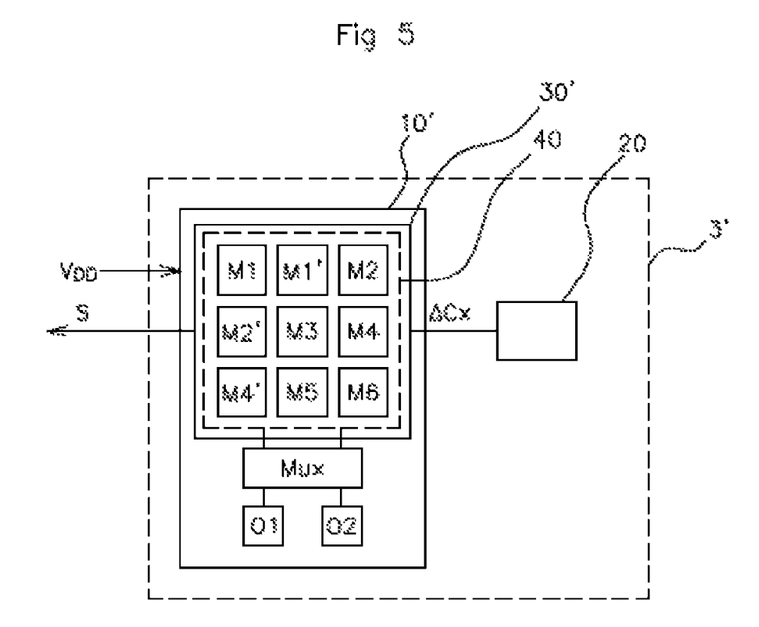
FIG. 5 represents the proximity detection sensor according to the invention.

The invention provides a capacitive sensor 3', as illustrated in FIG. 5.

The capacitive sensor 3' of the invention includes a calibration unit 40 for calibrating the standby duration included in the measuring unit 30' and electrically connected to each of the two oscillators O1, O2 via a switching means e.g. a multiplexer MUX.

The calibration unit 40 includes software enabling the standby duration $D_V$ to be calibrated using measurements made with the aid of the two oscillators O1 and O2, as described below.

Figure 6:
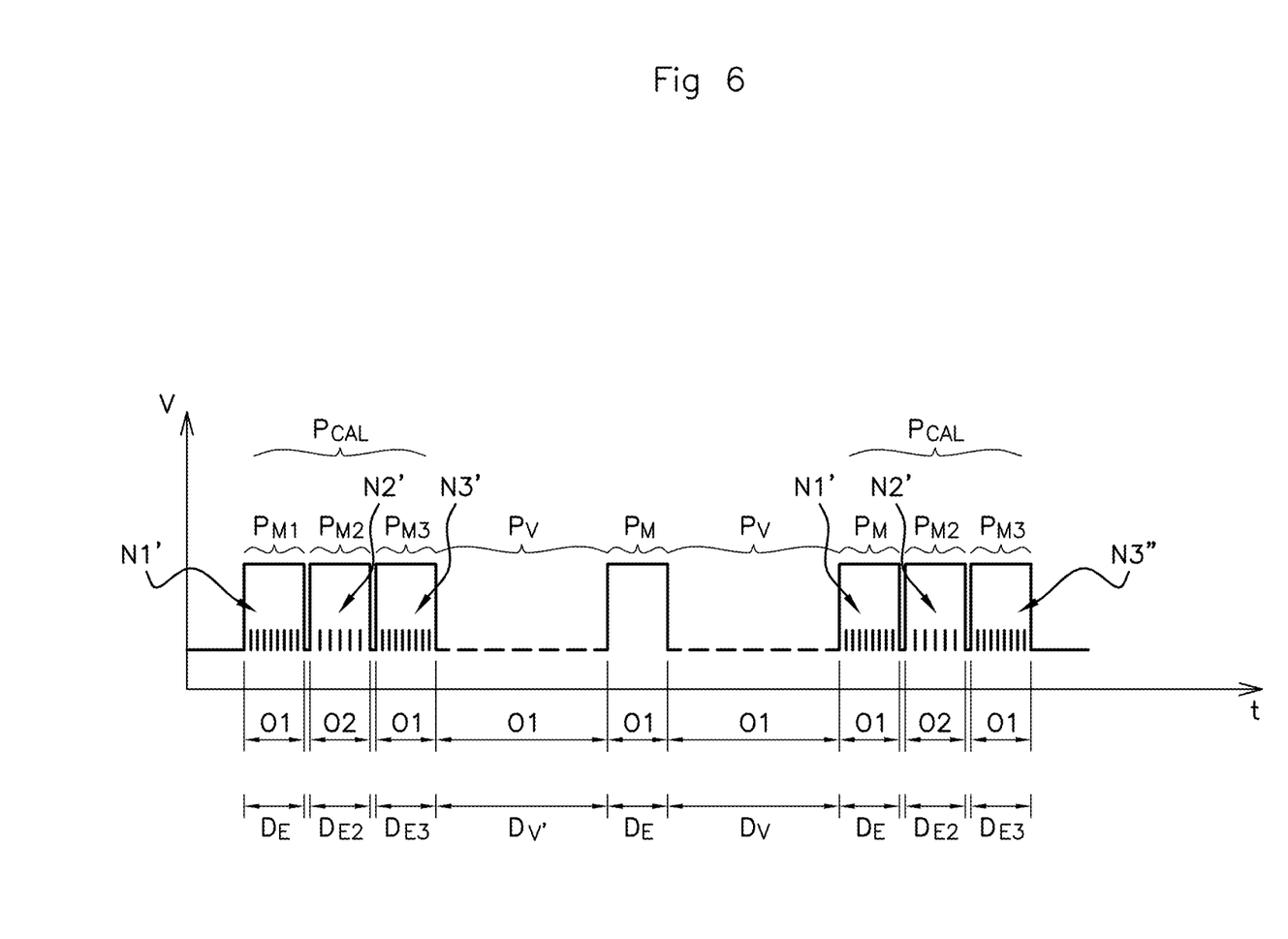
FIG. 6 represents the phases of calibrating the standby durations of the proximity detection sensor according to the invention.

The operation of the calibration unit 40 is described below and is illustrated in FIG. 6.

The phase of measuring $P_M$ the representative value of the users proximity, (i.e. the variation in the capacitance Cx of the electrode 4) during which the evaluation duration $D_E$ is measured using the first oscillator O1, is followed consecutively by a second measurement phase $P_{M2}$ during which a second evaluation duration $D_{E2}$ is measured using the second oscillator O2.

The calibration unit 40 receives from the first oscillator O1 a first number of oscillations N1' implemented during the measurement phase $P_M$ at its first oscillation frequency F1. Then a second measurement phase $P_{M2}$ is immediately repeated, and a second evaluation duration $D_{E2}$ is this time measured using the second oscillator O2 at its second frequency F2'. The calibration unit 40 then receives from the second oscillator O2 a number of oscillations N2' which are produced during said repetition of the measurement phase $P_{M2}$.

The second number of oscillations N2' is then divided by the first number of oscillations N1'. A ratio of number of oscillations $$R' = \frac{N2'}{N1'}$$

is then calculated.

This ratio of number of oscillations $$R' = \frac{N2'}{N1'}$$

thus calculated is compared with a predetermined ratio R.

The predetermined ratio R is equal to the ratio R between the second nominal frequency $F_{2nom}$ and the first frequency F1 respectively of the second and first oscillator O2, O1, that is $$R = \frac{F2_{nom}}{F1}.$$

The second nominal frequency $F2_{nom}$ is obtained when the second oscillator O2 does not display any drift in its second frequency F2.

With regard to the first frequency F1, given that the first oscillator O1, of the quartz clock type does not undergo any drift, this first frequency F1 is assumed to be constant and does not vary.

A deviation D between the calculated ratio R' and the predetermined ratio R is calculated.

Thus:

$$D = \frac{R'}{R}$$

During the standby phase $P_V$, the number of oscillations of the standby phase N2 is then corrected according to the deviation D thus calculated in order to obtain a corrected number of oscillations for the standby phase $N2_{corr}$ and to calibrate a new standby duration Dv' (see FIG. 6).

Thus:

$$N2_{corr} = \frac{N2'}{D}$$

The invention is based on the assumption that the evaluation duration $D_E$ remains the same between the two consecutive measurement phases $P_M$, $P_{M2}$ performed by each of the two oscillators O1, O2, i.e. $D_E = D_{E2}$ (see FIG. 6). In other words, it is assumed that the variation in the capacitance $\Delta Cx$ remains constant during said two successive measurements, since the evaluation duration $D_E$, $D_{E2}$ is directly dependent on the variation in the capacitance $\Delta Cx$ which is measured. This assumption can be made since the two measurement phases $P_M$, $P_{M2}$ are of very short duration (of the order of 15 ms) and are immediately consecutive.

Thus, the ratio of the number of oscillations $$R' = \frac{N2'}{N1'}$$

of the two oscillators O1, O2 is assumed to be equal to the ratio of the frequencies $$\frac{F2'}{F1}.$$

Indeed:

$$F2' = \frac{N2'}{D_{E2}}$$

$$F1 = \frac{N1'}{D_E}$$

It is assumed that $$D_E = D_{E2}$$

And therefore:

$$\frac{N2'}{N1'} = \frac{F2'}{F1}$$

With:
F2': second frequency of the second oscillator O2 (Hz),
F1: first frequency of the first oscillator O1 (Hz), N2': second number of oscillations of the second oscillator O2 during the repetition of the measurement phase PM2, N1: first number of oscillations of the first oscillator O1 during the measurement phase, $D_E$: evaluation duration of the measurement phase (s), $D_{E2}$: evaluation duration of the second measurement phase (s), In order to perform the calibration method according to the invention, the calibration unit 40 comprises (see FIG. 5):

means of performing M, consecutively to the measurement phase $P_M$, a second measurement phase $P_{M2}$, means of measuring M2 a second evaluation duration $D_{E2}$ using the second oscillator O2, means of calculating M3 a ratio R between a second number of oscillations N2' generated by the second oscillator O2 during the second measurement phase $P_{M2}$ and a first number of oscillations N1' generated by the first oscillator O1 during the measurement phase $P_M$, means of comparison M4 between the ratio R thus calculated and a predetermined ratio R', means of calculating M5 a deviation D between the ratio R and the predetermined ratio R', means of correcting M6, during the standby phase $P_V$, the number of oscillations of the standby phase $N2_{corr}$ according to the calculated deviation D in order to calibrate the standby duration $D_V$.

These various means M1, M2, M3, M4, M5, M6 are in the form of software.

In a second embodiment, a third measurement phase $P_{M3}$ by the first oscillator O1 is performed ($D_{E3}$, see FIG. 6) immediately after the second measurement phase $P_{M2}$ performed by the second oscillator O2.

The calibration unit then receives a third number of oscillations N3' performed during this third measurement phase $P_{M3}$ by the first oscillator O1.

Thus, the measurement of the second evaluation duration $D_{E2}$ by the second oscillator O2 is flanked by two measurements of the evaluation duration $D_E$, $D_{E3}$ performed by the first oscillator O1. It is immediately preceded and immediately followed by a measurement of the evaluation duration, $D_E$, $D_{E3}$, by the first oscillator O1.

If the first and third number of oscillations N1' and N3' measured by the first oscillator O1 during the measurement phase and the third measurement phase $P_M$, $P_{M3}$ are equal then, the ratio of the number of oscillations R' is calculated, compared with the predetermined ratio R and the standby duration $D_V$ is corrected (by correcting the number of oscillations of the standby phase N2) according to the deviation D calculated, as explained previously.

If the first and third number of oscillations N1' and N3' measured by the first oscillator O1 during the measurement phase and the third measurement phase $P_M$, $P_{M3}$ are not equal then the calibration procedure stops.

For implementing the second embodiment of the calibration method according to the invention, the calibration unit 40 comprises, in addition to the means used for the first embodiment and detailed above (M1, M2, M3, M4, M5, M6), the following means:

means of performing (M1'), consecutively to the second measurement phase ($P_{M2}$), a third measurement phase ($P_{M3}$), means of measuring (M2') a third evaluation duration $D_{E3}$ using the first oscillator (O1), means of comparison (M4') between the first number of oscillations (N1') of the measurement phase ($P_M$) and a third number of oscillations (N3') generated during the third measurement phase ($P_{M3}$).

Said means M1, M2', M4' are in the form of software.

A calibration phase $P_{CAL}$ according to the invention therefore includes:

in the first embodiment a measurement of the evaluation duration $D_E$ by the first oscillator O1 followed (or preceded) by a measurement of a second evaluation duration $D_{E2}$ by the second oscillator O2, assuming the two evaluation durations to be equal ($D_E=D_{E2}$), in the second embodiment, a measurement of the evaluation duration $D_E$ by the first oscillator O1, followed by a measurement of a second evaluation duration $D_{E2}$ by the second oscillator O2, itself followed by a measurement of a third evaluation duration $D_{E3}$ by the first oscillator O1, the calibration procedure stopping if the two evaluation duration measurements $D_E$ and $D_{E3}$ performed by the first oscillator O1 are not equal.

The evaluation durations $D_E$, $D_{E2}$, $D_{E3}$ each time being measured by the calibration unit 40 by counting the number of oscillations N1', N2', N3' performed by each of the first and second oscillators O1, O2.

In the first embodiment of the invention, the method of calibrating the standby duration $D_V$ of a capacitive sensor 3 therefore includes the following steps:

Step 1: the measurement phase $P_M$ performed by the first oscillator O1 is followed consecutively by a second measurement phase $P_{M2}$ during which a second evaluation duration $D_{E2}$ is measured by the second oscillator O2, Step 2: a ratio R between a second number of oscillations N2' generated by the second oscillator O2 during the second measurement phase $P_{M2}$ and a first number of oscillations N1' generated by the first oscillator O1 during the measurement phase PM is calculated, Step 3: the ratio R thus calculated is compared with a predetermined ratio R', equal to the ratio between the second nominal frequency $F2_{nom}$ and the first frequency F1, Step 4: a deviation D is calculated between the calculated ratio R and the predetermined ratio R', Step 5: during the standby phase $P_V$, the number of oscillations of the standby phase N2' is corrected $N2_{corr}$ according to the calculated deviation D in order to calibrate a new standby duration $D_V$.

In the second embodiment of the invention, the calibration method further includes:

Step 1b: after step 1, the second measurement phase $P_{M2}$ is followed consecutively by a third measurement phase $P_{M3}$ during which a third evaluation duration $D_{E3}$ is measured by the first oscillator O1, Step 1c: if the first number of oscillations N1' generated during the measurement phase by the first oscillator O1 is equal to a third number of oscillations N3' generated during the third measurement phase PM3 by the first oscillator O1, then repetition of steps 2 through 5, else the calibration procedure stops.

Of course, the calibration phase $P_{CAL}$ consumes more electrical energy than a measurement phase $P_M$, since it includes two or even three successive measurement phases $P_M$, $P_{M2}$, $P_{M3}$. It must not be repeated during each measurement phase $P_M$. For example, the calibration phase $P_{CAL}$ is performed at each power up of the capacitive sensor 3 then it is repeated after a predetermined number x of measurement phases $P_M$, or after a predetermined delay.

However, once performed, it reduces the electrical consumption during the x following standby phases $P_V$, up to the next calibration phase $P_{CAL}$.

It has been estimated that for a measurement phase $P_M$ repeated every 21 ms, of 1 ms duration, a standby phase of 19 ms duration with a calibration phase $P_{CAL}$ (steps 1 through 5) the duration of which is equal to 45 ms (3×15 ms) and which is repeated every 120 s, the calibration method according the invention, reduces the electrical consumption of the capacitive sensor 3 by about 14% and improves its reaction time by 19%.

The invention therefore judiciously uses the accurate measurement of the evaluation duration performed by the first oscillator for correcting the drift in frequency of the second oscillator and thus calibrating the standby duration.

Unlike the calibration method of the prior art, the calibration method according to the invention does not require any dedicated electronic tool, can be performed at each power up of the capacitive sensor, or periodically (e.g. every two minutes), does not require that the automobile be immobilized and is transparent to the driver.

The calibration method is fast and lasts 30 ms ($P_M$, $P_{M2}$) to 45 ms ($P_M$, $P_{M2}$, $P_{M3}$). It enables the frequency drift of the oscillator dedicated to managing the standby duration to be corrected. The excess electrical consumption is reduced and the reaction time of the sensor is maintained.

The invention claimed is:

1. A method of calibrating a standby duration of a proximity detection sensor configured to detect the proximity of a user, said sensor alternating between: (i) a first measurement phase of measuring a representative value of the user's proximity that is a variation in capacitance of an electrode of the proximity detection sensor, during an evaluation duration that varies according to said value, said evaluation duration being measured using a first oscillator, having a first oscillation frequency, and (ii) a standby phase for a predetermined standby duration, the predetermined standby duration being longer than the evaluation duration, and being controlled by a second oscillator, having a second oscillation frequency, which varies with respect to a second nominal oscillation frequency according to parameters external to the sensor, the calibration method comprising the following steps:

step 1: consecutively after the first measurement phase performed by the first oscillator, measuring, in a second measurement phase, a second evaluation duration by the second oscillator;

step 2: calculating a ratio between a second number of oscillations generated by the second oscillator during the second measurement phase and a first number of oscillations generated by the first oscillator during the first measurement phase;

step 3: comparing the calculated ratio with a predetermined ratio;

step 4: calculating a deviation between the ratio and the predetermined ratio; and step 5: during the standby phase, correcting the number of oscillations of the standby phase according to the calculated deviation in order to calibrate a new standby duration to correct a drift in the second oscillation frequency of the second oscillator, and thus a drift of the new standby duration caused by the variation in the second oscillation frequency in order to reduce an electrical consumption of the proximity detection sensor and improve a reaction time of the proximity detection sensor.

2. The calibration method as claimed in claim 1, wherein the predetermined ratio is equal to the ratio between the second nominal frequency and the first frequency.

3. The calibration procedure as claimed in claim 1, wherein steps 1 through 5 are performed at each power up of the proximity detection sensor.

4. The calibration procedure as claimed in claim 1, wherein steps 1 through 5 are repeated at a set period of the order of 120 s.

5. The calibration method as claimed in claim 1, further comprising:

step 1b: after step 1, consecutively after the second measurement phase, measuring, in a third measurement phase, a third evaluation duration by the first oscillator, step 1c: when the first number of oscillations of the first measurement phase is equal to a third number of oscillations generated during the third measurement phase, then repeating Steps 2-5, and when the first number of oscillations of the first measurement phase is not equal to the third number of oscillations generated during the third measurement phase, then stopping the calibration procedure.

6. The calibration method as claimed in claim 5, wherein the predetermined ratio is equal to the ratio between the second nominal frequency and the first frequency.

7. The calibration procedure as claimed in claim 5, wherein steps 1 through 5 are performed at each power up of the proximity detection sensor.

8. The calibration procedure as claimed in claim 5, wherein steps 1 through 5 are repeated at a set period of the order of 120 s.

9. A capacitive proximity detection sensor comprising:
a microcontroller including one or more processors configured to measure;
a detection electrode;
a first oscillator, having a first oscillation frequency measuring evaluation durations during phases of measuring a variation in capacitance of the electrode;
a second oscillator controlling predetermined standby durations during standby phases of the capacitive sensor, the second oscillator having a second oscillation frequency that varies with respect to a second nominal oscillation frequency according to parameters external to the capacitive sensor; and
a switching device connected to the first and second oscillators, and to the one or more processors configured to measure,
wherein the one or more processors is configured to calibrate, is connected to the switching device and is configured to
perform, consecutively to a first one of the measurement phases, a second measurement phase,
measure a second evaluation duration using the second oscillator,
calculate a ratio between a second number of oscillations generated by the second oscillator during the second measurement phase and a first number of oscillations generated by the first oscillator during the first measurement phase,
compare between the calculated ratio and a predetermined ratio,
calculate a deviation between the calculated ratio and the predetermined ratio, and
correct, during the standby phase, the number of oscillations of the standby phase according to the calculated deviation in order to calibrate the standby duration to correct a drift in the second oscillation frequency of the second oscillator, and thus a drift of the new standby duration caused by the variation in the second oscillation frequency in order to reduce an electrical consumption of the proximity detection sensor and improve a reaction time of the proximity detection sensor.

10. A motor vehicle door handle comprising:
the capacitive proximity detection sensor as claimed in claim 9.

11. A motor vehicle, comprising:
the capacitive proximity detection sensor as claimed in claim 9.

12. A capacitive proximity detection sensor:
a microcontroller including one or more processors configured to measure;
a detection electrode;
a first oscillator, having a first oscillation frequency measuring evaluation durations during phases of measuring a variation in capacitance of the electrode;
a second oscillator controlling predetermined standby durations during standby phases of the capacitive sensor, the second oscillator having a second oscillation frequency that varies with respect to a second nominal oscillation frequency according to parameters external to the capacitive sensor; and
a switching device connected to the first and second oscillators, and to the one or more processors configured to measure,
wherein the one or more processors is configured to calibrate, is connected to the switching device and is configured to
 perform, consecutively to a first one of the measurement phases, a second measurement phase,
 measure a second evaluation duration using the second oscillator,
 perform, consecutively to the second measurement phase, a third measurement phase,
 measure a third evaluation duration using the first oscillator,
 compare between the first number of oscillations of the first measurement phase and a third number of oscillations generated during the third measurement phase,
 calculate a ratio between a second number of oscillations generated by the second oscillator during the second measurement phase and a first number of oscillations generated by the first oscillator during the first measurement phase,
 compare between the calculated ratio and a predetermined ratio,
 calculate a deviation between the calculated ratio and the predetermined ratio,
 during the standby phase, the number of oscillations of the standby phase according to the calculated deviation in order to calibrate the standby duration to correct a drift in the second oscillation frequency of the second oscillator, and thus a drift of the new standby duration caused by the variation in the second oscillation frequency in order to reduce an electrical consumption of the proximity detection sensor and improve a reaction time of the proximity detection sensor.

13. A motor vehicle door handle comprising:
the capacitive proximity detection sensor as claimed in claim 12.

14. A motor vehicle, comprising:
the capacitive proximity detection sensor as claimed in claim 12.

* * * * *